United States Patent Office 2,847,287

Patented Aug. 12, 1958

2,847,287

ETCHING PROCESSES AND SOLUTIONS

Clarence R. Landgren, Morristown, N. J., assignor to Bell Telephone Laboratories, Incorporated, New York, N. Y., a corporation of New York No Drawing. Application July 20, 1956
Serial No. 599,007

8 Claims. (Cl. 41—42)

This invention relates to a process for the differential etching of silicon bodies and to solutions for such differential etching.

In the fabrication of some forms of semiconductive devices, for example, counting devices of the kind described in copending application Serial No. 579,006, filed April 18, 1956, by I. M. Ross, it is important at an intermediate stage to etch selectively surface portions of one conductivity type in a semiconductive wafer which includes surface portions of both conductivity types. The present invention is directed primarily at this problem.

In particular, in the interest of ease of application, an object of the invention is to realize such selective etching in a manner which does not require the application of voltages to the sample during etching and which does not effect the smoothness and cleanliness of the surface of the sample in an undesirable fashion. In addition, it is desirable that the selectivity of the etch be high.

These ends have all been achieved in accordance with the invention in a process which provides selective etching of p-type portions of a silicon body which includes both p-type and n-type surface regions.

A feature of the process of the present invention is the use as the etchant of an aqueous solution of potassium permanganate ($KMnO_4$) and hydrofluoric acid (HF). Immersion therein of a silicon body including both p-type and n-type surface regions has been found to result in rapid etching of the p-type portions with little effect on the n-type portions. In addition, it is possible to realize such differential etching while leaving the surface of the body clean and smooth.

While aqueous solutions of hydrofluoric acid and one of various other oxidizing agents have been known in the prior art for use as etchants of silicon, an aqueous solution of hydrofluoric acid and potassium permanganate has been found to possess unique advantages for the selective etching described. In particular, there were tested in this regard aqueous solutions of hydrofluoric acid and an oxidizing agent taken from the group including $H_3PO_4$, $H_2SO_4$, $(COOH)_2$, $HClO_4$, $HIO_4$, $HB_rO_3$, $FeCl_3$, $Ce(SO_4)_2$, $H_2CrO_4$, $HNO_3$, $Cu(NO_3)_2$, and $AgNO_3$, without realizing the advantages provided by the solution described.

The solution of hydrofluoric acid and potassium permanganate can be used effectively for the desired preferential etching in a wide range of proportions and dilutions. A convenient commercial source of the hydrofluoric acid is an aqueous hydrofluoric acid solution containing about 48.5 percent by weight of hydrogen fluoride.

A very satisfactory etchant for the purposes described has consisted of approximately three percent by weight potassium permanganate and the remainder such aqueous hydrofluoric acid solution. The composition by weight of this etchant accordingly is about three percent potassium permanganate, 47 percent hydrogen fluoride, and the remainder water. With such a solution at room temperature, it was found possible in five minutes to etch away a boron-diffused surface layer which was about .2 mil thick and had a sheet resistivity of about one ohm per square with no discernible effect on n-type surface portions having a sheet resistivity of several hundred ohms per square. A faster rate of etching may readily be achieved if desired simply by heating the etchant.

In the etchant described, the ratio by weight of hydrogen fluoride to potassium permanganate is approximately 16 to 1, and the mixture is diluted with approximately 50 percent by weight water. It has been found possible to vary the water dilution and still realize selective etching. However, when the water content is increased to above 60 percent by weight some staining of the surface is apt to result, which ordinarily is undesirable.

It has also been found possible to vary the ratio of hydrogen fluoride to potassium permanganate over wide limits and still achieve selective etching. In particular, quite useful selective etching may be obtained with compositions including by weight from 1 to 10 percent potassium permanganate and the remainder 48.5 percent aqueous hydrofluoric acid. In such a range of compositions, the etch will contain approximately by weight from 1 percent to 10 percent potassium permanganate, from 43 percent to 48 percent hydrogen fluoride and from 46 percent to 51 percent water. In general, the most suitable etches for the purposes of the present invention will lie within the ranges of about 1 percent to 10 percent potassium permanganate, about 40 to 50 percent hydrogen fluoride, and about 45 percent to 60 percent water. However, it is feasible to achieve selective etching with even smaller concentrations of potassium permanganate and if staining is tolerable with even larger concentrations of water and lower concentrations of hydrogen fluoride. Higher concentrations of potassium permanganate and hydrogen fluoride are limited only by the limits of their solubility in water.

At the completion of the etching process, it is generally advantageous to wash the sample in deionized water to remove all traces of the etchant.

The process which has been described appears insensitive to the manner in which the regions of different conductivity type have been formed on the surface of the body. However, it is found important for selective etching that there be surface regions of both conductivity types on the sample, since the etchant described has been found to etch significantly both p-type and n-type silicon when the surface of the sample is entirely of a single conductivity type.

This characteristic provides the etchant with added usefulness. In particular, it adapts it for use in special applications with a silicon sample which includes a surface layer of one conductivity type overlying a substrate which is of both conductivity types. In such applications, etching will occur over the entire surface of the body without regard to the conductivity type of the surface layer so long as only material of one conductivity type is exposed but after material of both conductivity types become exposed, selective etching occurs.

What is claimed is:

1. The process of etching selectively p-type surface portions of a silicon body including both p-type and n-type surface portions which comprises the step of immersing the body in an aqueous solution of hydrofluoric acid and potassium permanganate.

2. The process of etching selectively p-type surface portions of a silicon body including both p-type and n-type surface portions which comprises the step of immersing the body in an etching solution which corresponds to a mixture by weight of from 1 to 10 percent potassium permanganate and the remainder aqueous hydrofluoric acid containing 48.5 percent by weight hydrogen fluoride.

3. The process of etching selectively p-type surface portions of a silicon body including both p-type and n-type surface portions which comprises the step of immersing the body in an etchant which comprises by weight approximately 3 percent potassium permanganate, approximately 47 percent hydrogen fluoride, and the remainder water.

4. A solution for etching selectively p-type surface portions of a silicon body including both p-type and n-type surface portions which consists essentially of hydrogen fluoride, potassium permanganate, and water.

5. A solution for etching silicon which is an aqueous solution of hydrogen fluoride and potassium permanganate.

6. A solution for etching selectively p-type surface portions of a silicon body including both p-type and n-type surface portions which comprises by weight approximately 3 percent potassium permanganate, approximately 47 percent hydrogen fluoride, and the remainder water.

7. A solution for etching selectively p-type surface portions of a silicon body including both p-type and n-type surface portions which is an aqueous solution of hydrofluoric acid and potassium permanganate which corresponds to a mixture by weight of from 1 to 10 percent potassium permanganate and the remainder aqueous hydrofluoric acid containing 48.5 percent by weight hydrogen fluoride.

8. An etching solution for silicon comprising by weight from one percent to ten percent potassium permanganate, from forty to fifty percent hydrogen fluoride and from forty-five to sixty percent water.

References Cited in the file of this patent

UNITED STATES PATENTS

| | | |
|---|---|---|
| 2,583,681 | Brittain et al. | Jan. 29, 1952 |
| 2,692,212 | Jenkins et al. | Oct. 19, 1954 |
| 2,740,699 | Koury | Apr. 3, 1956 |